US012750042B2

(12) United States Patent
Lee et al.

(10) Patent No.: US 12,750,042 B2
(45) Date of Patent: Sep. 29, 2026

(54) TOGGLE FLIP-FLOP AND COUNTER INCLUDING THE SAME

(71) Applicant: SAMSUNG ELECTRONICS CO., LTD., Suwon-si (KR)

(72) Inventors: Jaeha Lee, Suwon-si (KR); Bai-Sun Kong, Suwon-si (KR); Bomin Joo, Suwon-si (KR)

(73) Assignees: SAMSUNG ELECTRONICS CO., LTD., Suwon-si (KR); Research & Business Foundation SUNGKYUNKWAN UNIVERSITY, Suwon-si (KR)

( * ) Notice: Subject to any disclaimer, the term of this patent is extended or adjusted under 35 U.S.C. 154(b) by 11 days.

(21) Appl. No.: 18/812,395

(22) Filed: Aug. 22, 2024

(65) Prior Publication Data

US 2025/0070763 A1 Feb. 27, 2025

(30) Foreign Application Priority Data

Aug. 23, 2023 (KR) ........................ 10-2023-0110794
Dec. 18, 2023 (KR) ........................ 10-2023-0185067

(51) Int. Cl.
*H03K 3/037* (2006.01)

(52) U.S. Cl.
CPC .................................. *H03K 3/0372* (2013.01)

(58) Field of Classification Search
CPC .................................................... H03K 3/0372
See application file for complete search history.

(56) References Cited

U.S. PATENT DOCUMENTS

| | | | |
|---|---|---|---|
| 7,440,534 B2 | 10/2008 | Morimura et al. |
| 7,973,581 B2 | 7/2011 | Mizuhashi et al. |
| 11,349,461 B2 | 5/2022 | Furuya |
| 11,664,258 B2 | 5/2023 | Lu et al. |

(Continued)

FOREIGN PATENT DOCUMENTS

KR 10-0253591 B1 4/2000

OTHER PUBLICATIONS

Kim, et al., "A Static Contention-Free Single-Phase-Clocked 24T Flip-Flop in 45nm for Low-Power Applications", 2014 IEEE International Solid-State Circuits Conference, Session 27, Energy-Efficient Digital Circuirts, 27.8, Feb. 2014, pp. 465-467.

(Continued)

*Primary Examiner* — Menatoallah Youssef
*Assistant Examiner* — Colleen J O Toole
(74) *Attorney, Agent, or Firm* — Morgan, Lewis & Bockius LLP

(57) ABSTRACT

A flip-flop configured to generate an output toggling according to an input clock includes an inverter configured to generate the output by inverting a first data signal, a first circuit configured to generate a second data signal based on an input clock and a latch signal, a second circuit configured to generate the latch signal based on the input clock and the second data signal, and a third circuit configured to generate the first data signal using the input clock, the second data signal, and the latch signal, wherein the third circuit is further configured to pull down the first data signal, independently of the second data signal, using the input clock and the latch signal.

20 Claims, 12 Drawing Sheets

(56) References Cited

U.S. PATENT DOCUMENTS

2021/0099161 A1 * 4/2021 Rasouli .............. H03K 3/35625

OTHER PUBLICATIONS

Kim, et al., "Low-Power CMOS Synchronous Counter With Clock Gating Embedded Into Carry Propagation", IEEE Transactions on Circuits and Systems—II: Express Briefs, vol. 56, No. 8, Aug. 2009, pp. 649-653.

Park, et al., "Design of a Dual Change-Sensing 24T Flip-Flop in 65 nm CMOS Technology for Ultra Low-Power System Chips", Electronics 2022, 11, 877, Mar. 2022, 10 pages.

Lin, et al., "Low-Power 19-Transistor True Single-Phase Clocking Flip-Flop Design Based on Logic Structure Reduction Schemes", IEEE Transactions on Very Large Scale Integration (VLSI) Systems, vol. 25, No. 11, Nov. 2017, pp. 3033-3044.

You, et al., "Low-Power Retentive True Single-Phase-Clocked Flip-Flop With Redundant-Precharge-Free Operation", IEEE Transactions on Very Large Scale Integration (VLSI) Systems, vol. 29, No. 5, May 2021, pp. 1022-1032>.

Morrison, et al., "Multistage Linear Feedback Shift Register Counters With Reduced Decoding Logic in 130-nm CMOS for Large-Scale Array Applications", IEEE Transactions on Very Large Scale Integration (VLSI) Systems, vol. 27, No. 1, Jan. 2019, pp. 103-115.

Cai, et al., "Ultra-Low Power 18-Transistor Fully Static Contention-Free Single-Phase Clocked Flip-Flop in 65-nm CMOS", IEEE Journal of Solid-State Circuits, vol. 54, No. 2, Feb. 2019, pp. 550-559.

Bae, et al., "High-Speed Counter With Novel LFSR State Extension", in IEEE Transactions on Computers, vol. 72, No. 3, Mar. 2023, pp. 893-899.

* cited by examiner

TOGGLE FLIP-FLOP AND COUNTER INCLUDING THE SAME

CROSS-REFERENCE TO RELATED APPLICATIONS

This application is based on and claims priority under 35 U.S.C. § 119 to Korean Patent Application No. 10-2023-0110794, filed on Aug. 23, 2023, and Korean Patent Application No. 10-2023-0185067, filed on Dec. 18, 2023, in the Korean Intellectual Property Office, the disclosures of which are incorporated by reference herein in their entireties.

BACKGROUND

1. Technical Field

The inventive concept relates to a flip-flop, and more particularly, to a toggle flip-flop and a counter including the same.

2. Discussion of Related Art

Integrated circuits that process digital signals may include circuits such as flip-flops and latches. Flip-flops and latches have two stable states that can store state information. Flip-flops may latch an input based on a clock signal and output a latched input. Flip-flops may include transistors and have various structures according to their applications. Integrated circuits manufactured by semiconductor processes may include a plurality of flip-flops. The performance and physical areas of flip-flops may impact the performance and size of the integrated circuits.

SUMMARY

The inventive concept provides a toggle flip-flop having high reliability and a reduced area, and a counter including the same.

According to an aspect of the inventive concept, there is provided a flip-flop configured to generate an output toggling according to an input clock. The flip-flop includes an inverter configured to generate the output by inverting a first data signal, a first circuit configured to generate a second data signal based on the input clock and a latch signal, a second circuit configured to generate the latch signal based on the input clock and the second data signal, and a third circuit configured to generate the first data signal using the input clock, the second data signal, and the latch signal, wherein the third circuit is further configured to pull down the first data signal, independently of the second data signal, using the input clock and the latch signal.

According to another aspect of the inventive concept, there is provided a flip-flop configured to generate an output toggling according to an input clock. The flip-flop includes an inverter configured to generate the output by inverting a first data signal, a first circuit configured to generate a second data signal based on the input clock and a latch signal, a second circuit configured to generate the latch signal based on the input clock and the second data signal, and a third circuit configured to generate the first data signal based on the input clock, the second data signal, and the latch signal, wherein the third circuit includes a first n-channel field effect transistor (NFET) and a second NFET connected between a first output node, at which the first data signal is generated, and a first power node, to which a negative supply voltage applied, the first NFET and the second NFET respectively receiving the input clock and the latch signal.

According to a further aspect of the inventive concept, there is provided a method of generating an output toggling according to an input clock. The method includes generating the output by inverting a first data signal, generating a second data signal by inverting the first data signal when the input clock is logic low and by inverting a latch signal when the input clock is logic high, generating the latch signal as logic high when the input clock is logic low and generating the latch signal by inverting the second data signal when the input clock is logic high, and holding the first data signal when the input clock is logic low and generating the first data signal by inverting the latch signal when the input clock is logic high.

BRIEF DESCRIPTION OF THE DRAWINGS

Embodiments will be more clearly understood from the following detailed description taken in conjunction with the accompanying drawings in which.

DETAILED DESCRIPTION

Figure 1:
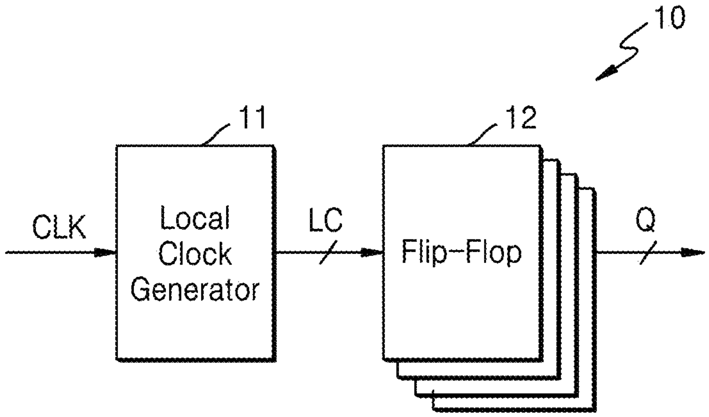
FIG. 1 is a block diagram of a counter including flip-flops, according to an embodiment.

Hereinafter, embodiments will be described in detail with reference to the accompanying drawings. The same reference numerals may be used for the same components in the drawings, and redundant descriptions thereof may be omitted.

The disclosure allows for various changes and numerous embodiments, specific embodiments will be illustrated in the drawings and described in detail in the written description. However, this is not intended to limit embodiments to particular modes of practice, and it is to be appreciated that all changes, equivalents, and substitutes that do not depart from the spirit and technical scope of the inventive concept are encompassed by the disclosure. In the disclosure, certain detailed descriptions may be omitted when they serve to obscure the essence of the inventive concept.

FIG. 1 is a block diagram of a counter 10 including flip-flops 12, according to an embodiment. In some embodiments, the counter 10 may be included in an integrated circuit (IC) that is manufactured by semiconductor processes. Unless stated otherwise, signals may be assumed to be active-high signals that are logic high during activation and logic low during deactivation. However, it should be noted that embodiments are not limited thereto. Logic high may correspond to a positive supply voltage VDD (e.g., a positive supply voltage node) and may be expressed as "1". Logic low may correspond to a negative supply voltage VSS (e.g., a negative supply voltage node) and may be expressed as "0".

As shown in FIG. 1, the counter 10 may receive a clock signal CLK and generate an output Q. The counter 10 may count an event based on the clock signal CLK and generate the output Q corresponding to the count. For example, the counter 10 may count a rising edge (positive edge) or a falling edge (negative edge) of the clock signal CLK. Although it is assumed herein that the counter 10 counts a rising edge of the clock signal CLK, it should be noted that embodiments are not limited thereto. In some embodiments, the counter 10 may operate as an up counter or a down counter. For example, the counter 10 may receive an up signal and operate as an up counter in response to the up signal that is activated, i.e., "1", or as a down counter in response to the up signal that is deactivated, i.e., "0".

As shown in FIG. 1, the counter 10 may include a local clock generator 11 and the flip-flops 12. The local clock generator 11 may generate a local clock LC based on the clock signal CLK and provide the local clock LC to the flip-flops 12. As described with reference to FIG. 2, the local clock LC may determine the transition time of each bit in the output Q.

The flip-flops 12 may receive the local clock LC from the local clock generator 11 and may generate the output Q. The counter 10 may include the flip-flops 12 that respectively generate bits in the output Q. The number of flip-flops 12 may correspond to the number of bits in the output Q. As described with reference to FIG. 2, each of the flip-flops 12 may transition a bit of the output Q on a rising edge or a falling edge of a bit of the local clock LC. In other words, each of the flip-flops 12 may correspond to a toggle flip-flop.

An IC may include a plurality of counters. Each of the counters may include a plurality of flip-flops 12. For example, each of the counters may output Q having a number of bits equal to the number of flip-flops 12 in the counter. As described herein with reference to the accompanying drawings, each of the flip-flops 12 may have a structure as a toggle flip-flop and include a reduced number of transistors. Accordingly, the IC may have a reduced area or high integration. Each of the flip-flops 12 may also have high reliability, and accordingly, the performance and operational reliability of the IC may be increased.

Figure 2:
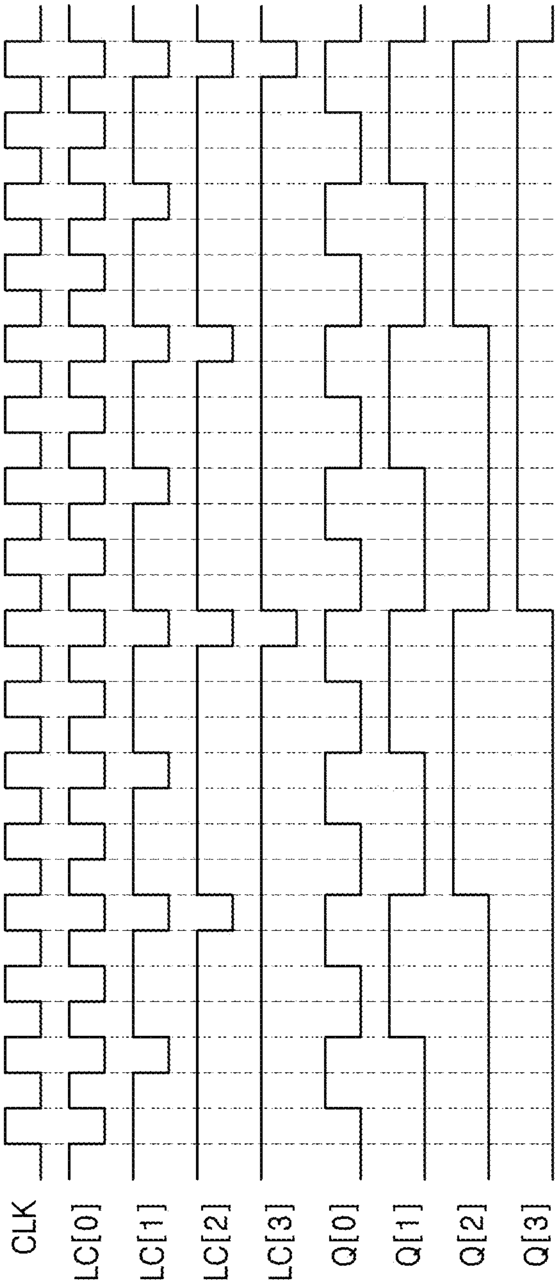
FIG. 2 is a timing diagram illustrating an operation of a flip-flop, according to an embodiment.

FIG. 2 is a timing diagram illustrating an operation of a flip-flop, according to an embodiment. FIG. 2 is described with reference to FIG. 1 herein. For example, the timing diagram of FIG. 2 illustrates the operation of the counter 10 as an up counter, which includes the flip-flops 12. In FIG. 2, it may be assumed that the counter 10 is a 4-bit counter. Accordingly, the local clock LC and the output Q may each be a 4-bit signal.

Referring to FIG. 2, the local clock generator 11 may generate a first bit LC[0], a second bit LC[1], a third bit LC[2], and a fourth bit LC[3] of the local clock LC. The local clock LC may be synchronized with the clock signal CLK and may oscillate with a period of the clock signal CLK. When the first bit LC[0] of the local clock LC is 0 (or low) and a first bit Q[0] of the output Q is 1 (or high), the second bit LC[1] of the local clock LC may transit to 0 in synchronization with the clock signal CLK. When the first bit LC[0] and the second bit LC[1] (bits LC[1:0]) of the local clock LC are 0 and the first bit Q[0] and a second bit Q[1] (bits Q[1:0]) of the output Q are 1, the third bit LC[2] of the local clock LC may transit to 0 in synchronization with the clock signal CLK. When the first bit LC[0], the second bit LC[1], and the third bit LC[2] (bits LC[2:0]) of the local clock LC are 0 and the first bit Q[0], the second bit Q[1], and a third bit Q[2] (bits Q[2:0]) of the output Q are 1, the fourth bit LC[3] of the local clock LC may transit to 0 in synchronization with the clock signal CLK.

Four flip-flops 12 may respectively receive four bits LC[3:0] (the first bit LC[0], the second bit LC[1], the third bit LC[2], and the fourth bit LC[3]) of the local clock LC and respectively generate four bits Q[3:0] (the first bit Q[0], the second bit Q[1], the third bit Q[2], and a fourth bit Q[3]) of the output Q. For example, a first flip-flop may receive the first bit LC[0] of the local clock LC and generate the first bit Q[0] of the output Q, which transits at a rising edge of the first bit LC[0] of the local clock LC. A second flip-flop may receive the second bit LC[1] of the local clock LC and generate the second bit Q[1] of the output Q, which transits at a rising edge of the second bit LC[1] of the local clock LC. A third flip-flop may receive the third bit LC[2] of the local clock LC and generate the third bit Q[2] of the output Q, which transits at a rising edge of the third bit LC[2] of the local clock LC. A fourth flip-flop may receive the fourth bit LC[3] of the local clock LC and generate the fourth bit Q[3] of the output Q, which transits at a rising edge of the third bit LC[3] of the local clock LC. Examples of toggle flip-flops, such as the flip-flops 12, which generate outputs toggling at a rising edge of a clock input, are described herein with reference to the accompanying drawings.

Figure 3:
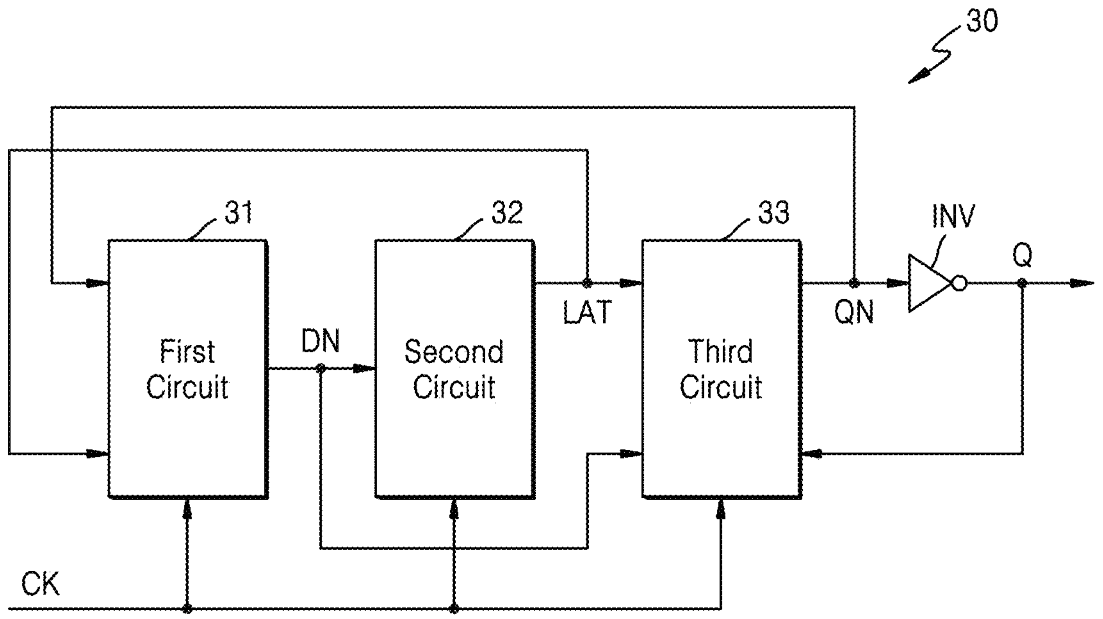
FIG. 3 is a block diagram of a flip-flop according to an embodiment.

FIG. 3 is a block diagram of a flip-flop 30 according to an embodiment. For example, FIG. 3 shows a toggle flip-flop as an example of a flip-flop of the flip-flops 12 in FIG. 1. Herein, a toggle flip-flop may be referred to as a flip-flop unless stated otherwise. As shown in FIG. 3, the flip-flop 30 may include a first circuit 31, a second circuit 32, and a third circuit 33. The flip-flop 30 may further include an inverter INV. In some embodiments, as described herein with reference to FIG. 9, at least two of the first to third circuits 31, 32, and 33 may share a transistor. Accordingly, the flip-flop 30 may include a reduced number of transistors and may occupy a reduced area.

An input clock CK may be provided to the first circuit 31, the second circuit 32, and the third circuit 33. The first circuit 31 may receive the input clock CK, a first data signal QN, and a latch signal LAT. The first circuit 31 may generate a second data signal DN. The first data signal QN may be generated by the third circuit 33, which is described herein, and may correspond to an inverted signal of the output Q. The first circuit 31 may generate the second data signal DN. The first circuit 31 may generate the second data signal DN based on the input clock CK and the first data signal QN. The second data signal DN and the first data signal QN may be offset complementary signals as described herein. As described herein with reference to FIG. 8, the second data signal DN may be synchronized with a falling edge of the input clock CK. An example of the first circuit 31 is described herein with reference to FIG. 4.

The second circuit 32 may receive the input clock CK and the second data signal DN, and may generate the latch signal LAT. The latch signal LAT may be provided to the first circuit 31 and the third circuit 33. As described herein with reference to the accompanying drawings, the latch signal LAT may control a transistor included in a path (e.g., a current path) that pulls down the second data signal DN in the first circuit 31. The latch signal LAT may control a transistor that pulls up the first data signal QN in the third circuit 33 or may control a transistor included in a path (e.g., a current path) that pulls down the first data signal QN in the third circuit 33. An example of the second circuit 32 is described with reference to FIG. 5.

The third circuit 33 may receive the input clock CK, the second data signal DN, the latch signal LAT, and the output Q. The third circuit 33 may generate the first data signal QN. The first data signal QN may correspond to an inverted signal of the output Q. As shown in FIG. 3, as the first data signal QN may be transmitted to the first circuit 31, and the flip-flop 30 may operate as a toggle flip-flop. The third circuit 33 may receive the output Q from the inverter INV and may hold the first data signal QN by latching the first data signal QN according to the input clock CK. An example of the third circuit 33 is described herein with reference to FIG. 6.

The inverter INV may receive the first data signal QN and may generate the output Q by inverting the first data signal QN. In some embodiments, the inverter INV may include a p-channel field effect transistor (p-channel FET or PFET) and an n-channel field effect transistor (n-channel FET or NFET), which may be connected in series to each other between a first power node to which the positive supply voltage VDD may be applied and a second power node to which the negative supply voltage VSS may be applied.

Figure 4:
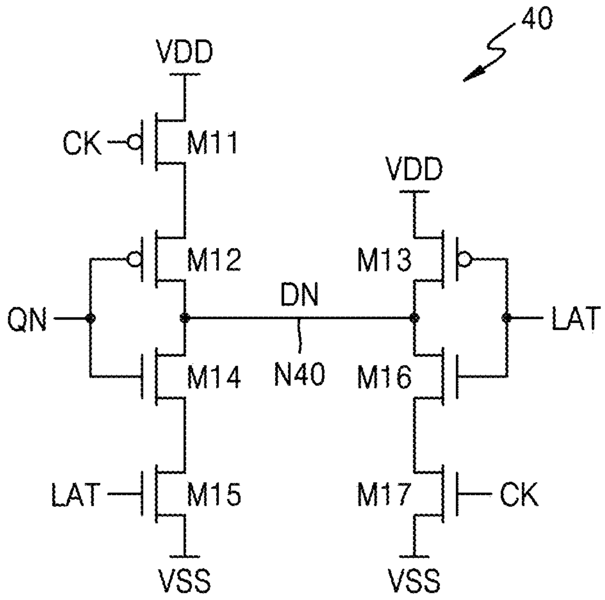
FIG. 4 is a circuit diagram of a first circuit according to an embodiment.

FIG. 4 is a circuit diagram of a first circuit 40 according to an embodiment. For example, FIG. 4 illustrates an example of the first circuit 31 in FIG. 3. As described herein with reference to FIG. 3, the first circuit 40 may generate the second data signal DN based on the input clock CK, the first data signal QN, and the latch signal LAT. As shown in FIG. 4, the first circuit 40 may include first to seventh transistors M11 to M17. The first to third transistors M11 to M13 may correspond to PFETs and the fourth to seventh transistors M14 to M17 may correspond to NFETs. Each of the first to seventh transistors M11 to M17 may include a gate receiving one of the input clock CK, the first data signal QN, or the latch signal LAT.

The first transistor M11 and the second transistor M12 may be connected in series to each other between a first power node, to which the positive supply voltage VDD is applied, and an output node N40, at which the second data signal DN is generated, and may respectively receive the input clock CK and the first data signal QN. In some embodiments, the first transistor M11 and the second transistor M12 may be connected in series to each other in an order different than that shown in FIG. 4. In some embodiments, as described with reference to FIG. 9, the first transistor M11 of the first circuit 40 may be shared with the third circuit 33 in FIG. 3. For example, the first transistor M11 may be a component of the first circuit 40 in FIG. 4 and the third circuit 60 in FIG. 6, wherein the first transistor M11 and the second transistor M32 may be a same transistor. The third transistor M13 may be connected between the first power node, to which the positive supply voltage VDD is applied, and the output node N40 and may receive the latch signal LAT.

The fourth transistor M14 and the fifth transistor M15 may be connected in series to each other between the output node N40 and a second power node, to which the negative supply voltage VSS is applied, and may respectively receive the first data signal QN and the latch signal LAT. In some embodiments, the fourth transistor M14 and the fifth transistor M15 may be connected in series to each other in an order different than that shown in FIG. 4. In some embodiments, as described with reference to FIG. 9, the fifth transistor M15 of the first circuit 40 may be shared with the third circuit 33 in FIG. 3. For example, the fifth transistor M15 may be a component of the first circuit 40 in FIG. 4 and the third circuit 60 in FIG. 6, wherein the fifth transistor M15 and the sixth transistor M36 may be a same transistor. The sixth transistor M16 and the seventh transistor M17 may be connected in series to each other between the output node N40 and the second power node, to which the negative supply voltage VSS is applied, and may respectively receive the latch signal LAT and the input clock CK. In some embodiments, the sixth transistor M16 and the seventh transistor M17 may be connected in series to each other in an order different than that shown in FIG. 4. In some embodiments, as described with reference to FIG. 9, the seventh transistor M17 of the first circuit 40 may be shared with the second circuit 32 in FIG. 3. For example, the seventh transistor M17 may be a component of the first circuit 40 in FIG. 4 and the second circuit 50 in FIG. 5, wherein the seventh transistor M17 and the fourth transistor M24 may be a same transistor.

Referring to FIG. 4, when the input clock CK is logic low, i.e., 0, the latch signal LAT may be 1, as described with reference to FIG. 5. Accordingly, the first circuit 40 may generate the second data signal DN by inverting the first data signal QN by using the second transistor M12 and the fourth transistor M14. When the input clock CK is logic high, i.e., 1, the latch signal LAT may be "1", the first circuit 40 may generate the second data signal DN by inverting the latch signal LAT by using the third transistor M13 and the sixth transistor M16.

Figure 5:
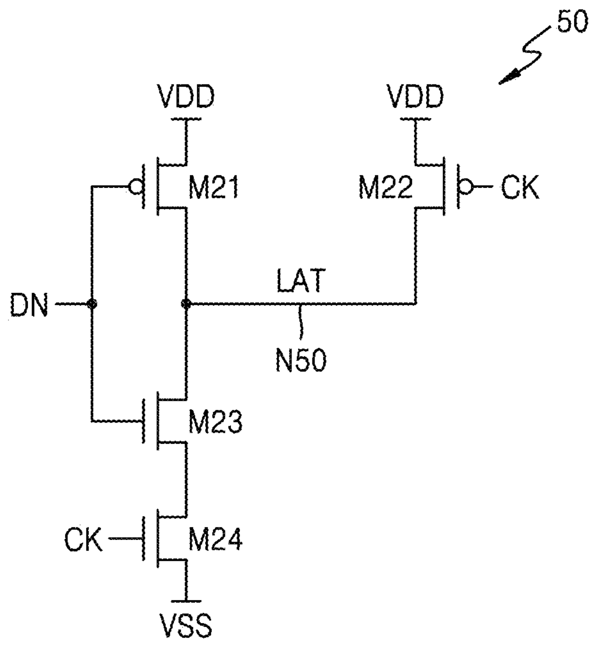
FIG. 5 is a circuit diagram of a second circuit according to an embodiment.

FIG. 5 is a circuit diagram of a second circuit 50 according to an embodiment. For example, FIG. 5 illustrates an example of the second circuit 32 in FIG. 3. As described herein with reference to FIG. 3, the second circuit 50 may generate the latch signal LAT based on the input clock CK and the second data signal DN. As shown in FIG. 5, the second circuit 50 may include first to fourth transistors M21 to M24. The first and second transistors M21 and M22 may correspond to PFETs and the third and fourth transistors M23 and M24 may correspond to NFETs. Each of the first to fourth transistors M21 to M24 may include a gate receiving one of the input clock CK or the second data signal DN.

The first transistor M21 and the second transistor M22 may be connected in parallel between a first power node, to which the positive supply voltage VDD is applied, and an output node N50, at which the latch signal LAT is generated, and may respectively receive the second data signal DN and the input clock CK.

The third transistor M23 and the fourth transistor M24 may be connected in series to each other between the output node N50 and a second power node, to which the negative supply voltage VSS is applied, and may respectively receive the second data signal DN and the input clock CK. In some embodiments, the third transistor M23 and the fourth transistor M24 may be connected in series to each other in an order different than that shown in FIG. 5. In some embodiments, the fourth transistor M24 of the second circuit 50 may be shared with the first circuit 31 in FIG. 3. For example, the fourth transistor M24 may be a component of the first circuit 40 in FIG. 4 and the second circuit 50 in FIG. 5, wherein the fourth transistor M24 and the seventh transistor M17 may be a same transistor. That is, as described with reference to FIG. 9, the fourth transistor M24 and the seventh transistor M17 in FIG. 4 may be a same transistor.

Referring to FIG. 5, when the input clock CK is 0, the second circuit 50 may generate the latch signal LAT that is pulled up to "1" by the second transistor M22. When the input clock CK is 1, the second circuit 50 may generate the latch signal LAT by inverting the second data signal DN by using the first transistor M21 and the third transistor M23.

Figure 6:
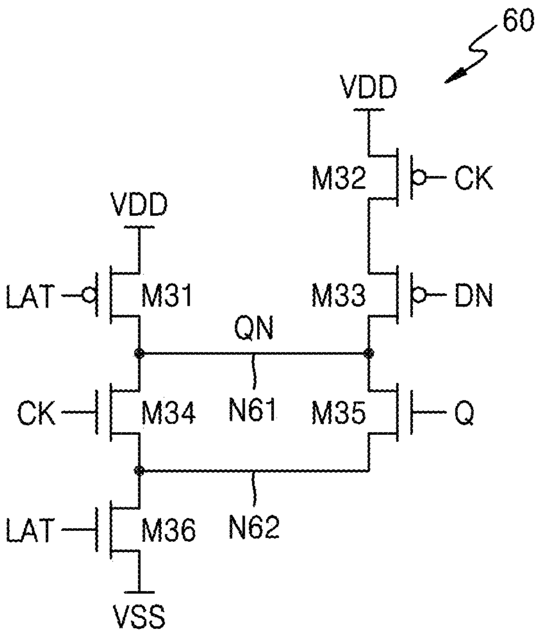
FIG. 6 is a circuit diagram of a third circuit according to an embodiment.

FIG. 6 is a circuit diagram of a third circuit 60 according to an embodiment. For example, FIG. 6 illustrates an example of the third circuit 33 in FIG. 3. As described herein with reference to FIG. 3, the third circuit 60 may generate the first data signal QN based on the input clock CK, the second data signal DN, the latch signal LAT, and the output Q. As shown in FIG. 6, the third circuit 60 may include first to sixth transistors M31 to M36. The first to third transistors M31 to M33 may correspond to PFETs and the fourth to sixth transistors M34 to M36 may correspond to NFETs. Each of the first to sixth transistors M31 to M36 may include a gate receiving one of the input clock CK, the second data signal DN, the latch signal LAT, or the output Q.

The first transistor M31 may be connected between a first power node, to which the positive supply voltage VDD is applied, and a first node N61, at which the first data signal QN is generated, and may receive the latch signal LAT. The second transistor M32 and the third transistor M33 may be connected in series to each other between the first power node, to which the positive supply voltage VDD is applied, and the first node N61 and may respectively receive the input clock CK and the second data signal DN. In some embodiments, the second transistor M32 and the third transistor M33 may be connected in series to each other in an order different than that shown in FIG. 6. In some embodiments, the second transistor M32 of the third circuit 60 may be shared with the first circuit 31 in FIG. 3. For example, the second transistor M32 may be a component of the first circuit 40 in FIG. 4 and the third circuit 60 in FIG. 6, wherein the first transistor M11 and the second transistor M32 may be a same transistor. That is, as described with reference to FIG. 9, the second transistor M32 and the first transistor M11 in FIG. 4 may be a same transistor.

The fourth transistor M34 and the fifth transistor M35 may be connected in parallel between the first node N61 and a second node N62 and may respectively receive the input clock CK and the output Q. The sixth transistor M36 may be connected between the second node N62 and a second power node, to which the negative supply voltage VSS is applied. The sixth transistor M36 may receive the latch signal LAT. In some embodiments, the sixth transistor M36 of the third circuit 60 may be shared with the first circuit 31 in FIG. 3. For example, the sixth transistor M36 may be a component of the first circuit 40 in FIG. 4 and the third circuit 60 in FIG. 6, wherein the fifth transistor M15 and the sixth transistor M36 may be a same transistor. That is, as described with reference to FIG. 9, the sixth transistor M36 and the fifth transistor M15 in FIG. 4 may be a same transistor.

Referring to FIG. 6, when the input clock CK is 0, the latch signal LAT may be 1, as described herein with reference to FIG. 5. Accordingly, when the second data signal DN is 0, the first data signal QN may be 1 due to the second transistor M32 and the third transistor M33. When the second data signal DN is 1, the first data signal QN may be 0 due to the fifth transistor M35 and the sixth transistor M36. In other words, when the input clock CK is 0, the third circuit 60 may hold the first data signal QN. For example, with a falling edge of the input clock CK, the third circuit 60 may hold the first data signal QN at 0 or 1 for a time (e.g., a clock cycle). When the input clock CK is 1, the third circuit 60 may pull the first node N61 up or pull the first node N61 down according to the latch signal LAT. For example, when the latch signal LAT is 0, the first node N61 may be pulled up by the first transistor M31 and the first data signal QN may be 1. When the latch signal LAT is 1, the first node N61 may be pulled down by the fourth transistor M34 and the sixth transistor M36 and the first data signal QN may be 0.

The pull-down path (or discharge path) of the first node N61 may include the fourth transistor M34 and the sixth transistor M36, which respectively receive the input clock CK and the latch signal LAT. Accordingly, the first node N61 may be pulled down (or discharged) according to the input clock CK and the latch signal LAT, independently of the second data signal DN, and the first data signal QN may transit to 0. For example, the first data signal QN may be complementary to the second data signal DN and offset by a time (e.g., a clock cycle) relative to the second data signal DN. For example, the first data signal QN may be pulled down in advance of a transit of the second data signal DN to 1. For example, the first data signal QN and the second data signal DN may be offset complementary signals. As a result, the latency of a flip-flop may decrease and the speed and reliability of the flip-flop may increase.

Figure 7:
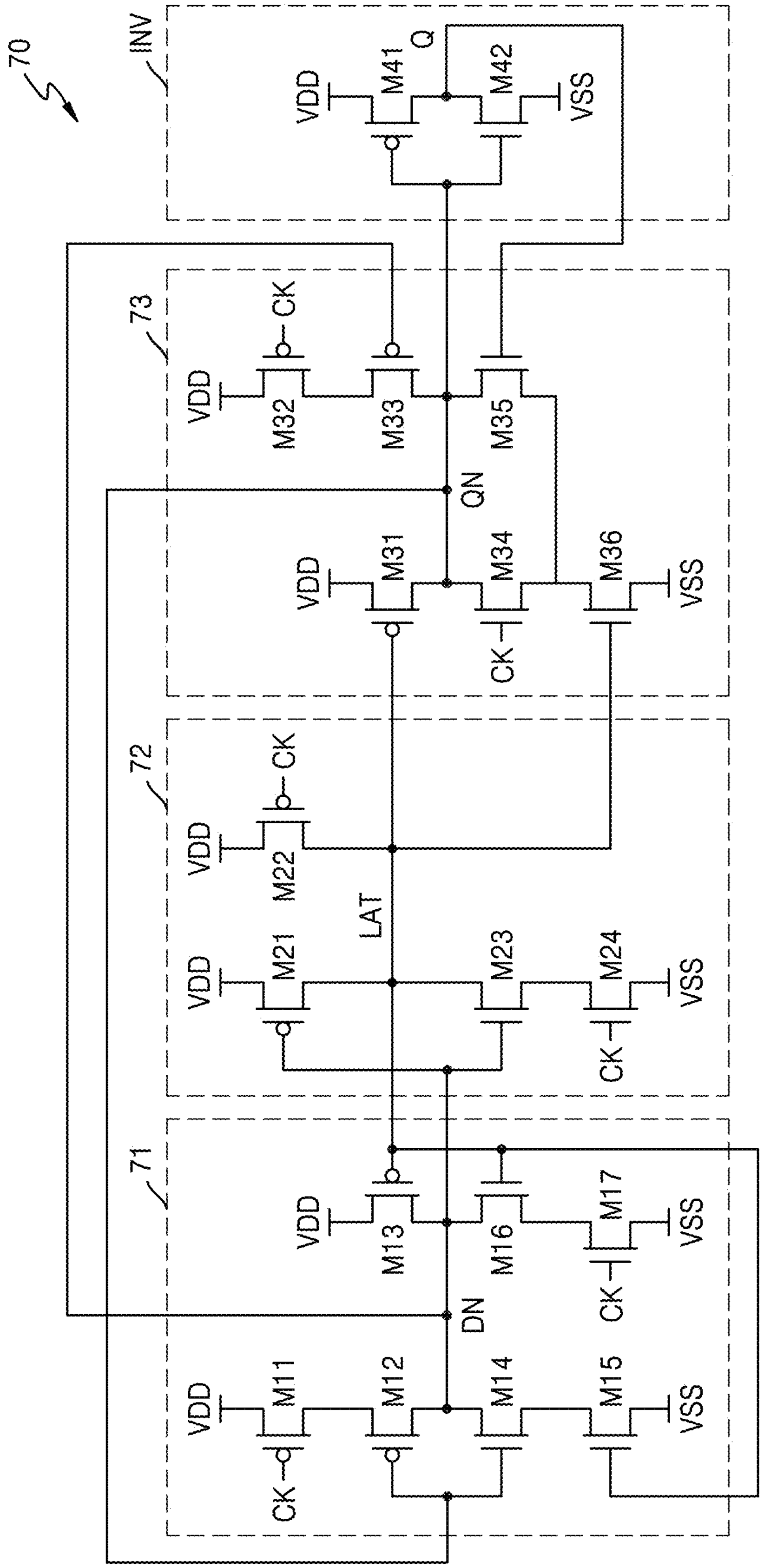
FIG. 7 is a circuit diagram of a flip-flop according to an embodiment.

FIG. 7 is a circuit diagram of a flip-flop 70 according to an embodiment. As described herein with reference to the accompanying drawings, the flip-flop 70 may include a first circuit 71, a second circuit 72, and a third circuit 73. The flip-flop 70 may further include an inverter INV. Redundant descriptions given herein with reference to the accompanying drawings may be omitted below.

Referring to FIG. 7, the first circuit 71 may correspond to the first circuit 40 of FIG. 4. For example, as shown in FIG. 7, the first circuit 71 may include the first to seventh transistors M11 to M17. The second circuit 72 may correspond to the second circuit 50 of FIG. 5. For example, as shown in FIG. 7, the second circuit 72 may include the first to fourth transistors M21 to M24. The third circuit 73 may correspond to the third circuit 60 of FIG. 6. For example, as shown in FIG. 7, the third circuit 73 may include the first to sixth transistors M31 to M36.

The inverter INV may include a first transistor M41 corresponding to a PFET and a second transistor M42 corresponding to an NFET. The first transistor M41 and the second transistor M42 may be connected in series to each other between a first power node, to which the positive supply voltage VDD is applied, and a second power node, to which the negative supply voltage VSS is applied. The first transistor M41 and the second transistor M42 may each receive the first data signal QN. The output Q may be generated from a node, which is connected to the first transistor M41 and the second transistor M42.

In some embodiments, the first transistor M11 and the second transistor M12 of the first circuit 71, and the node at which the second data signal DN is generated may be disposed in a configuration different than that shown in FIG. 7. In some embodiments, the fourth transistor M14 and the fifth transistor M15 of the first circuit 71, and the second power node to which the negative supply voltage VSS is applied may be disposed in a configuration different than that shown in FIG. 7. In some embodiments, the sixth transistor M16 and the seventh transistor M17 of the first circuit 71, and the second power node to which the negative supply voltage VSS is applied may be disposed in a configuration different than that shown in FIG. 7. In some embodiments, the third transistor M23 and the fourth transistor M24 of the second circuit 72, and the second power node to which the negative supply voltage VSS is applied may be disposed in a configuration different than that shown in FIG. 7. In some embodiments, the second transistor M32 and the third transistor M33 of the third circuit 73, and the output node at which the first data signal QN is generated may be disposed in a configuration different than that shown in FIG. 7.

Figure 8:
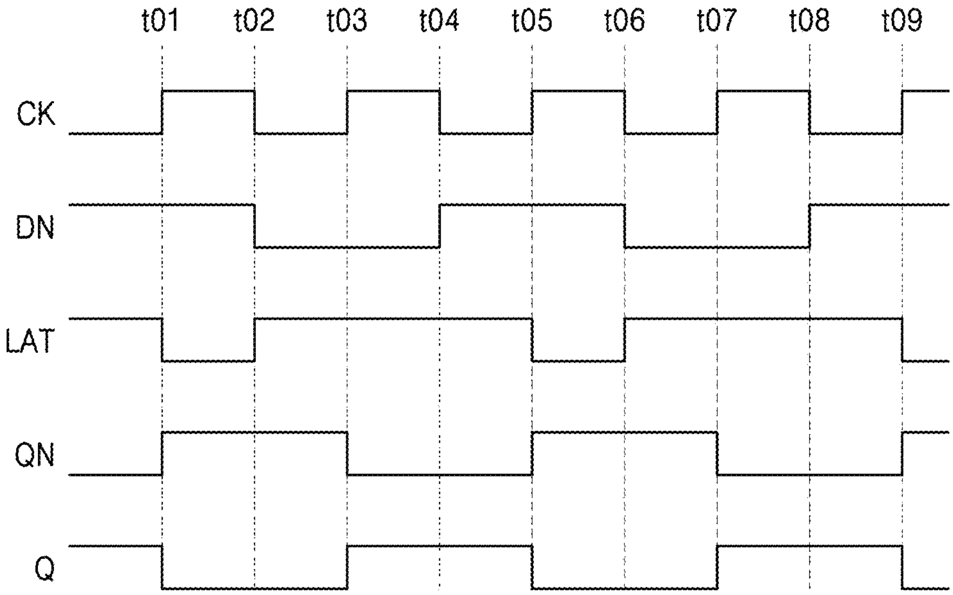
FIG. 8 is a timing diagram illustrating an operation of a flip-flop, according to an embodiment.

FIG. 8 is a timing diagram illustrating the operation of a flip-flop, according to an embodiment. For example, the timing diagram of FIG. 8 illustrates the operation of the flip-flop 70 of FIG. 7. FIG. 8 is described with reference to FIG. 7.

Referring to FIG. 8, before a time t01, the input clock CK and the first data signal QN may be 0 and the output Q may be 1. The latch signal LAT may be 1 due to the second transistor M22 of the second circuit 72, wherein the second transistor M22 of the second circuit 72 receives the input clock CK. The second data signal DN may be 1 due to the first transistor M11 and the second transistor M12 of the first circuit 71, which respectively receive the input clock CK and the first data signal QN.

At the time t01, a rising edge of the input clock CK may occur. The latch signal LAT may transit to 0 due to the third transistor M23 and the fourth transistor M24 of the second circuit 72, which respectively receive the second data signal DN and the input clock CK. The first data signal QN may transit to 1 due to the first transistor M31 of the third circuit 73, which receives the latch signal LAT. The output Q may transit to 0 due to the inverter INV receiving the first data signal QN having been transited to 1. The second data signal DN may be held at 1 by the third transistor M13 of the first circuit 71, which receives the latch signal LAT.

At a time t02, a falling edge of the input clock CK may occur. The latch signal LAT may transit to 1 due to the second transistor M22 of the second circuit 72, which receives the input clock CK. The second data signal DN may transit to 0 due to the fourth transistor M14 and the fifth transistor M15 of the first circuit 71, which respectively receive the first data signal QN and the latch signal LAT. The first data signal QN may be held at 1 by the second transistor M32 and the third transistor M33 of the third circuit 73, which respectively receive the input clock CK and the second data signal DN.

At a time t03, a rising edge of the input clock CK may occur. The first data signal QN may transit to 0 due to the fourth transistor M34 and the sixth transistor M36 of the third circuit 73, which respectively receive the input clock CK and the latch signal LAT. The output Q may transit to 1 due to the inverter INV receiving the first data signal QN pulled down to 0. The second data signal DN may be held at 0 by the sixth transistor M16 and the seventh transistor M17 of the first circuit 71, which respectively receive the latch signal LAT and the input clock CK. The latch signal LAT may be held at 1 by the first transistor M21 of the second circuit 72, which receives the second data signal DN.

At a time t04, a falling edge of the input clock CK may occur. The latch signal LAT may be held at 1 by the second transistor M22 of the second circuit 72, which receives the input clock CK. The second data signal DN may transit to 1 due to the first transistor M11 and the second transistor M12 of the first circuit 71, which respectively receive the input clock CK and the first data signal QN. The first data signal QN may be held at 0 by the fifth transistor M35 and the sixth transistor M36 of the third circuit 73, which respectively receive the output Q and the latch signal LAT.

At a time t05, a rising edge of the input clock CK may occur. The latch signal LAT may transit to 0 due to the third transistor M23 and the fourth transistor M24 of the second circuit 72, which respectively receive the second data signal DN and the input clock CK. The first data signal QN may transit to 1 due to the first transistor M31 of the third circuit 73, which receives the latch signal LAT. The output Q may transit to 0 due to the inverter INV receiving the first data signal QN having been transited to 1. The second data signal DN may be held at 1 by the third transistor M13 of the first circuit 71, which receives the latch signal LAT.

At a time t06, a falling edge of the input clock CK may occur. The latch signal LAT may transit to 1 due to the second transistor M22 of the second circuit 72, which receives the input clock CK. The second data signal DN may transit to 0 due to the fourth transistor M14 and the fifth transistor M15 of the first circuit 71, which respectively receive the first data signal QN and the latch signal LAT. The first data signal QN may be held at 1 by the second transistor M32 and the third transistor M33 of the third circuit 73, which respectively receive the input clock CK and the second data signal DN.

At a time t07, a rising edge of the input clock CK may occur. The first data signal QN may transit to 0 due to the fourth transistor M34 and the sixth transistor M36 of the third circuit 73, which respectively receive the input clock CK and the latch signal LAT. The output Q may transit to 1 due to the inverter INV receiving the first data signal QN pulled down to 0. The second data signal DN may be held at 0 by the sixth transistor M16 and the seventh transistor M17 of the first circuit 71, which respectively receive the latch signal LAT and the input clock CK. The latch signal LAT may be held at 1 by the first transistor M21 of the second circuit 72, which receives the second data signal DN.

At a time t08, a falling edge of the input clock CK may occur. The latch signal LAT may be held at 1 by the second transistor M22 of the second circuit 72, which receives the input clock CK. The second data signal DN may transit to 1 due to the first transistor M11 and the second transistor M12 of the first circuit 71, which respectively receive the input clock CK and the first data signal QN. The first data signal QN may be held at 0 by the fifth transistor M35 and the sixth transistor M36 of the third circuit 73, which respectively receive the output Q and the latch signal LAT.

At a time t09, a rising edge of the input clock CK may occur. The latch signal LAT may transit to 0 due to the third transistor M23 and the fourth transistor M24 of the second circuit 72, which respectively receive the second data signal DN and the input clock CK. The first data signal QN may transit to 1 due to the first transistor M31 of the third circuit 73, which receives the latch signal LAT. The output Q may transit to 0 due to the inverter INV receiving the first data signal QN having been transited to 1. The second data signal DN may be held at 1 by the third transistor M13 of the first circuit 71, which receives the latch signal LAT.

Figure 9:
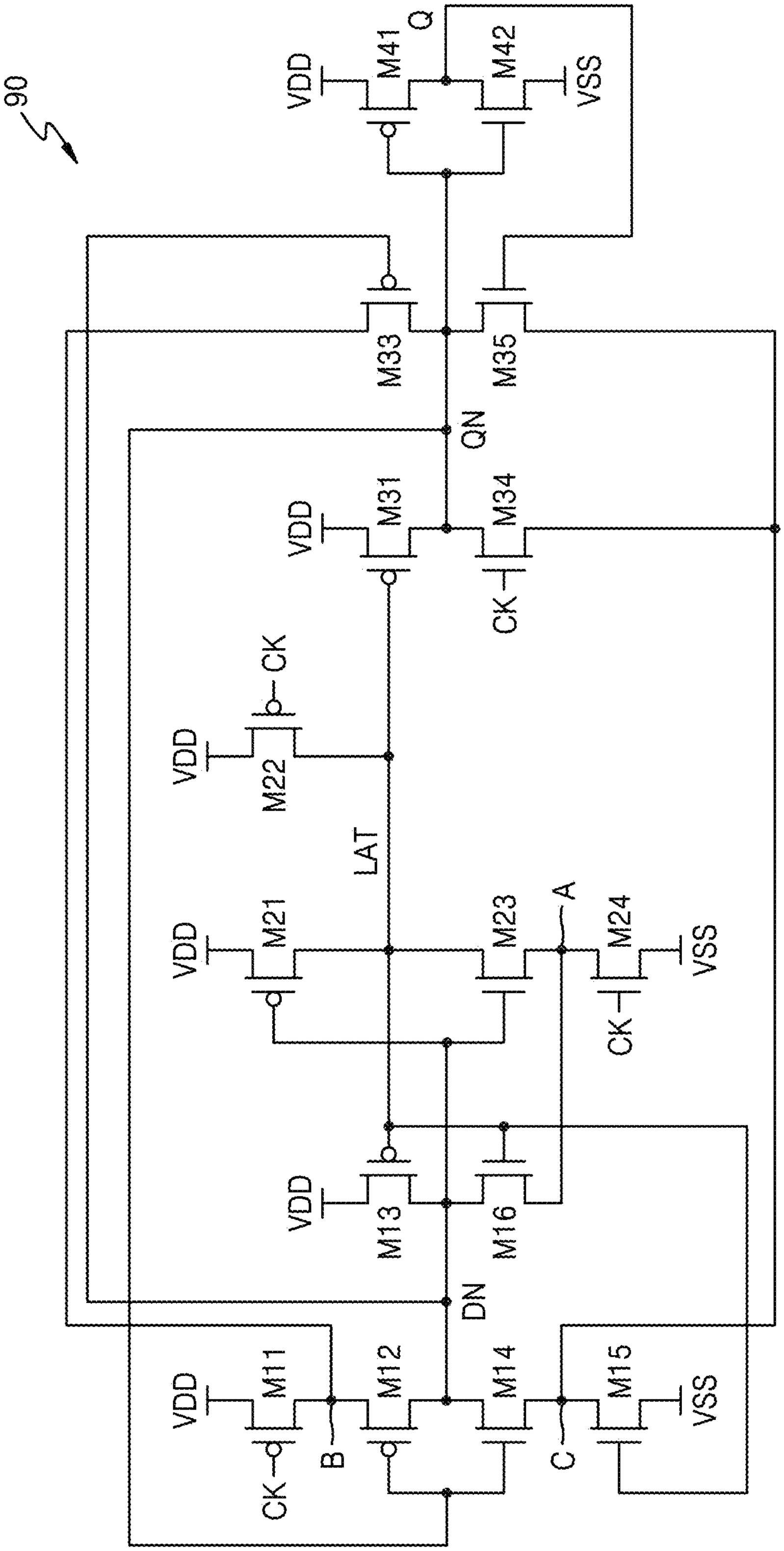
FIG. 9 is a circuit diagram of a flip-flop according to an embodiment.

FIG. 9 is a circuit diagram of a flip-flop 90 according to an embodiment. For example, the circuit diagram of FIG. 9 illustrates the flip-flop 90 having a structure in which at least one transistor of the flip-flop 70 of FIG. 7 may be shared by different circuits. FIG. 9 is described with reference to FIG. 7, and redundant descriptions given herein with reference to the accompanying drawings may be omitted below. It should be noted that transistors, which are described herein as being shared, may be shared by at least two circuits. For example, a same transistor may be a component of a first circuit and a second circuit. As shown in FIG. 9, the flip-flop 90 may include a total of 16 transistors including two transistors forming an inverter INV.

Referring to FIG. 9, the flip-flop 90 may include a plurality of transistors. For example, the flip-flop 90 may include first to sixth transistors M11 to M16 corresponding to the first circuit 71. The flip-flop 90 may include first to fourth transistors M21 to M24 corresponding to the second circuit 72. The flip-flop 90 may include a first transistor M31 and third to fifth transistors M33 to M35, which correspond to the third circuit 73. The flip-flop 90 may include a first transistor M41 and a second transistor M42, which correspond to the inverter INV.

In some embodiments, the first circuit 71 and the second circuit 72 may share at least one transistor. For example, the fourth transistor M24 receiving the input clock CK may be shared by the first circuit 71 and the second circuit 72. As shown in FIG. 9, a node A, to which the third transistor M23 and the fourth transistor M24 are connected, may be connected to the sixth transistor M16. In other words, the seventh transistor M17 of the first circuit 71 and the fourth transistor M24 of the second circuit 72, which receive the input clock CK in FIG. 7, may be replaced with the fourth transistor M24 in FIG. 9, which receives the input clock CK. For example, the fourth transistor M24 may perform the function of the fourth transistor M24 of the second circuit 72 and perform the function of the seventh transistor M17 of the first circuit 71.

In some embodiment, the first circuit 71 and the third circuit 73 may share at least one transistor. For example, the first transistor M11 receiving the input clock CK may be shared by the first circuit 71 and the third circuit 73. As shown in FIG. 9, a node B, to which the first transistor M11 and the second transistor M12 are connected, may be connected to the third transistor M33. In other words, the first transistor M11 of the first circuit 71 and the second transistor M32 of the third circuit 73, which receive the input clock CK in FIG. 7, may be replaced with the first transistor M11 in FIG. 9, which receives the input clock CK. For example, the first transistor M11 may perform the function of the first transistor M11 of the first circuit 71 and perform the function of the second transistor M32 of the third circuit 73.

In some embodiment, the fifth transistor M15 receiving the latch signal LAT may be shared by the first circuit 71 and the third circuit 73. As shown in FIG. 9, a node C, to which the fourth transistor M14 and the fifth transistor M15 are connected, may be connected to the fifth transistor M35. In other words, the fifth transistor M15 of the first circuit 71 and the sixth transistor M36 of the third circuit 73, which receive the latch signal LAT in FIG. 7, may be replaced with the fifth transistor M15 in FIG. 9, which receives the latch signal LAT. For example, the fifth transistor M15 may perform the function of the fifth transistor M15 of the first circuit 71 and perform the function of the sixth transistor M36 of the third circuit 73.

Figure 10:
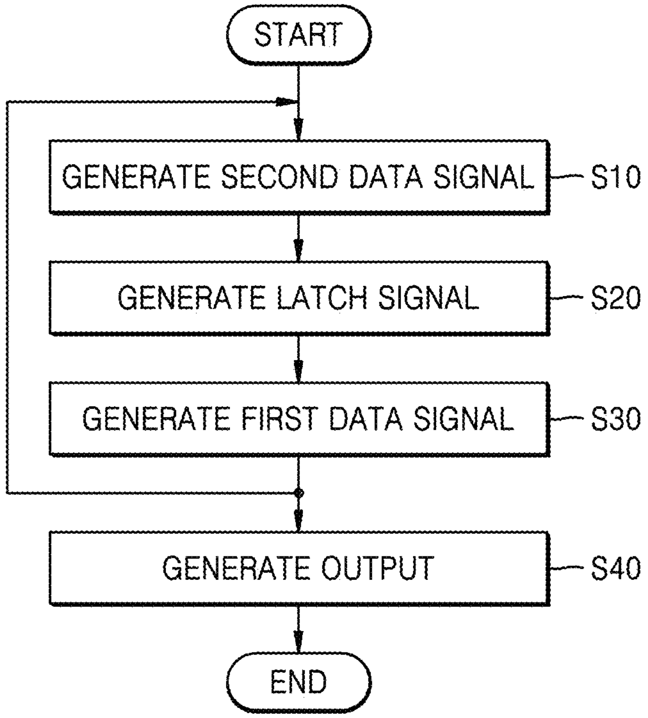
FIG. 10 is a flowchart of an operation of a flip-flop, according to an embodiment.

FIG. 10 is a flowchart of the operation of a flip-flop, according to an embodiment. Here, the operation of FIG. 10 may be referred to as a method of generating the output Q. The output Q that may toggle according to the input clock CK. As shown in FIG. 10, a method of generating the output Q that toggles according to the input clock CK may include a plurality of operations S10 to S40. A method of FIG. 10 may be repeatedly performed according to the input clock CK. As shown in FIG. 10, the first data signal QN generated in operation S30 may be fed back to operation S10. In some embodiments, a method of FIG. 10 may be performed by the flip-flop 30 of FIG. 3. FIG. 10 is described with reference to FIG. 3.

Referring to FIG. 10, the second data signal DN may be generated in operation S10. For example, the first circuit 31 may generate the second data signal DN based on the input clock CK, the first data signal QN, and the latch signal LAT. When the input clock CK is 0, the first circuit 31 may generate the second data signal DN by inverting the first data signal QN. When the input clock CK is 1, the first circuit 31 may generate the second data signal DN by inverting the latch signal LAT. In some embodiments, as described herein with reference to FIG. 4, operation S10 may be performed by the first circuit 31, which includes PFETs (e.g., transistors M11 to M13 in FIG. 4) respectively receiving the input clock CK, the first data signal QN, and the latch signal LAT, NFETs (e.g., transistors M14 and M15 in FIG. 4) respectively receiving the first data signal QN and the latch signal LAT, and NFETs (e.g., transistors M16 and M17 in FIG. 4) respectively receiving the latch signal LAT and the input clock CK.

The latch signal LAT may be generated in operation S20. For example, the second circuit 32 may generate the latch signal LAT based on the input clock CK and the second data signal DN. When the input clock CK is 0, the second circuit 32 may generate the latch signal LAT that is 1. When the input clock CK is 1, the second circuit 32 may generate the latch signal LAT by inverting the second data signal DN. In some embodiments, as described herein with reference to FIG. 5, operation S20 may be performed by the second circuit 32, which includes PFETs (e.g., transistors M21 and M22 in FIG. 5) respectively receiving the second data signal DN and the input clock CK and NFETs (e.g., transistors M23 and M24 in FIG. 5) respectively receiving the second data signal DN and the input clock CK.

The first data signal QN may be generated in operation S30. For example, the third circuit 33 may generate the first data signal QN based on the input clock CK, the second data signal DN, the latch signal LAT, and the output Q. When the input clock CK is 0, the third circuit 33 may hold the first data signal QN. When the input clock CK is 1, the third circuit 33 may generate the first data signal QN by inverting the latch signal LAT. As described herein with reference to FIG. 6, operation S30 may be performed by the third circuit 33, which includes PFETs (e.g., transistors M31 to M33 in FIG. 6) respectively receiving the latch signal LAT, the input clock CK, and the second data signal DN and NFETs (e.g., transistors M34 to M36 in FIG. 6) respectively receiving the input clock CK, the latch signal LAT, and the output Q.

In some embodiments, when the input clock CK and the latch signal LAT are 1, operation S30 may include pulling down a node that generates the first data signal QN. For example, as described herein with reference to FIG. 6, the pull-down path (or discharge path) of an output node that generates the first data signal QN may include a first transistor and a second transistor that respectively receive the input clock CK and the latch signal LAT. Accordingly, the output node may be pulled down (or discharged) according to the input clock CK and the latch signal LAT, independently of the second data signal DN, and the first data signal QN may transit to 0. For example, the first data signal QN may be complementary to the second data signal DN and offset by a time (e.g., a clock cycle) relative to the second data signal DN. For example, the first data signal QN may be pulled down in advance of a transit of the second data signal DN to 1. For example, the first data signal QN and the second data signal DN may be offset complementary signals. As a result, the latency of a flip-flop may decrease and the speed and reliability of the flip-flop may increase.

The output Q may be generated in operation S40. For example, the inverter INV may generate the output Q by inverting the first data signal QN generated in operation S30.

As described herein with reference to FIG. 8, the output Q may transit at a rising edge of the input clock CK.

Figure 11:
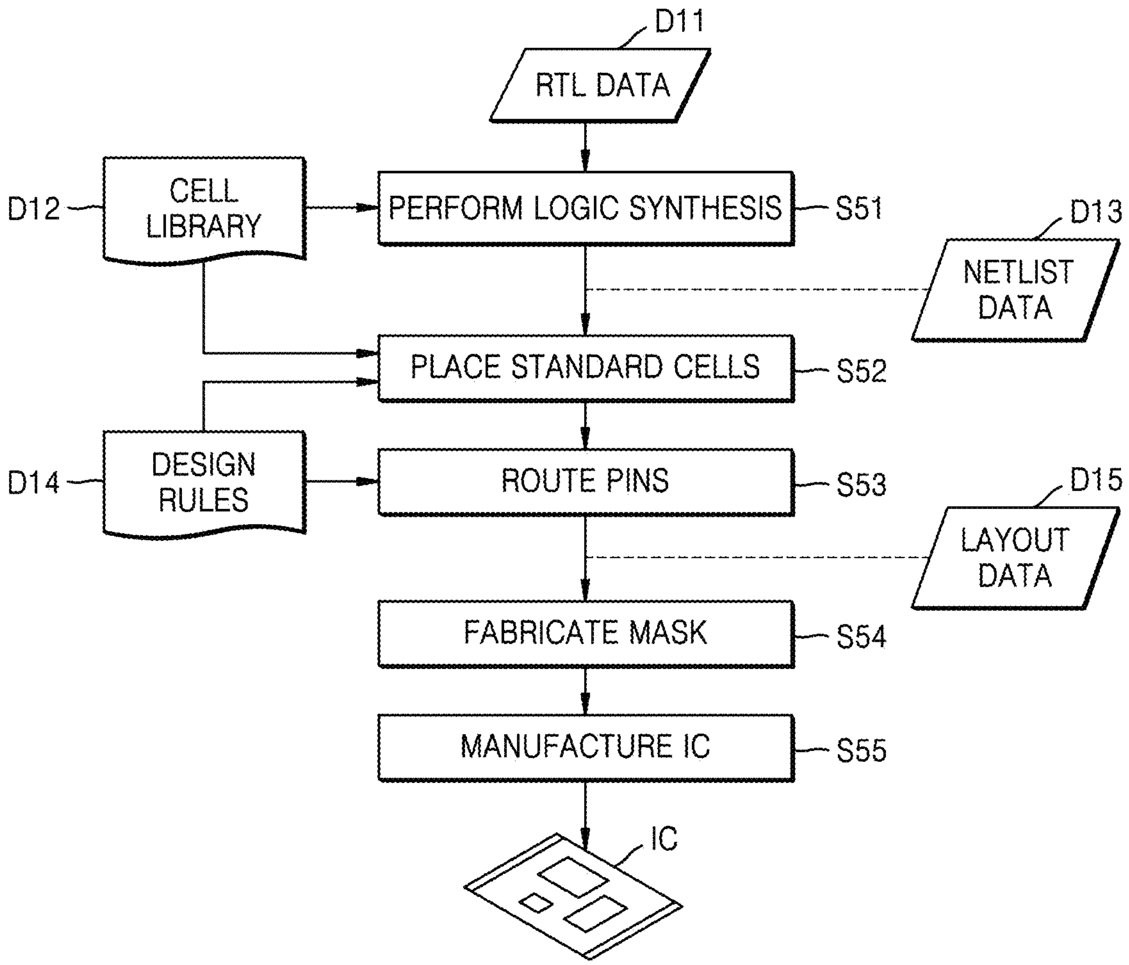
FIG. 11 is a flowchart of a method of manufacturing an integrated circuit, according to an embodiment.

FIG. 11 is a flowchart of a method of manufacturing an IC, according to an embodiment. In detail, the flowchart of FIG. 11 shows an example of a method of manufacturing an IC including standard cells. A standard cell may be a unit of a layout included in an IC and designed to perform a predefined function. As shown in FIG. 11, the method of manufacturing an IC may include operations S51, S52, S53, S54, and S55.

A cell library (or a standard cell library) D12 may include information about standard cells, e.g., information about functions, characteristics, layouts, or the like of standard cells. In some embodiments, a flip-flop, such as a toggle flip-flop described herein with reference to the accompanying drawings, may be included in the IC as a standard cell. For example, the cell library D12 may include information about cells corresponding to the flip-flop described with reference to the accompanying drawings. A counter including flip-flops described herein with reference to the accompanying drawings may be included in the IC as a standard cell. For example, the cell library D12 may include information about a counter corresponding to the flip-flops described herein with reference to the accompanying drawings. Accordingly, the IC may have increased performance and reliability and may have a reduced area or high integration.

Design rules D14 may include specifications for the layout of an IC. For example, the design rules D14 may include specifications for the spacing between patterns in a layer, a width (e.g., minimum width) of a pattern, a routing direction of a wiring layer, and the like. In some embodiments, the design rules D14 may define a spacing (e.g., minimum spacing) in a track of a wiring layer.

Logic synthesis, by which netlist data D13 may be generated from RTL data D11, may be performed in operation S51. For example, a semiconductor design tool (e.g., a logic synthesis tool) may perform logic synthesis on the RTL data D11, which may be written in hardware description language (HDL) like very high speed IC (VHSIC) HDL (VHDL) and Verilog, with reference to the cell library D12, and generate the netlist data D13. The netlist data D13 may correspond to the input of placement and routing, which is described herein.

Standard cells may be placed in operation S52. For example, a semiconductor design tool (e.g., a P&R tool) may place standard cells, which may be used in the netlist data D13, with reference to the cell library D12. In some embodiments, a semiconductor design tool may place standard cells in rows extending parallel with each other, and the standard cells may be provided with power from a power rail, which may extend along the boundary between the rows.

The pins of the standard cells may be routed in operation S53. For example, a semiconductor design tool may generate interconnections that electrically connect the output pins and input pins of placed standard cells and may generate layout data D15 that defines the placed standard cells and the interconnections. An interconnection may include a via of a via layer and/or patterns of wiring layers. In some embodiments, wiring layers may include a front side wiring layer disposed above a gate electrode and a backside wiring layer disposed below the gate electrode. For example, the layout data D15 may have a format like GDSII and may include geometrical information of cells and interconnections. A semiconductor design tool may refer to the design rules D14 using in routing the pins of cells. The layout data D15 may correspond to the output of placement and routing. Operation S53 may be solely, or operations S52 and S53 may be collectively referred to as a method of designing an IC.

A mask may be fabricated in operation S54. For example, optical proximity correction (OPC) for correcting distortion, such as refraction, caused by the characteristics of light in photolithography may be performed on the layout data D15. Patterns on a mask may be defined to form patterns arranged in a plurality of layers, based on data that has undergone OPC, and at least one mask (or photomask) for forming patterns of each layer may be fabricated. In some embodiments, the layout of an IC may be modified in operation S54. Any modification of an IC in operation S54 may be a post processing operation for improving the structure of the IC. The post processing operation may be referred to as design polishing.

An IC may be manufactured in operation S55. For example, an IC may be manufactured by patterning a plurality of layers by using at least one mask, which may be fabricated in operation S54. For example, front-end-of-line (FEOL) may include one or more of planarizing and cleaning a wafer, forming a trench, forming a well, forming a gate electrode, or forming a source and a drain. Individual devices, e.g., transistors, capacitors, resistors, etc., may be formed in a substrate via the FEOL. Back-end-of-line (BEOL) may include one or more of silicidation of a gate and source and drain regions, adding a dielectric, planarization, forming a hole, adding a metal layer, forming a via, or forming a passivation layer. The individual devices, e.g., transistors, capacitors, resistors, etc., may be interconnected with each other via the BEOL. In some embodiments, middle-of-line (MOL) may be performed between FEOL and BEOL such that contacts may be formed on individual devices. Thereafter, the IC may be packaged in a semiconductor package and used as a component of various applications.

Figure 12:
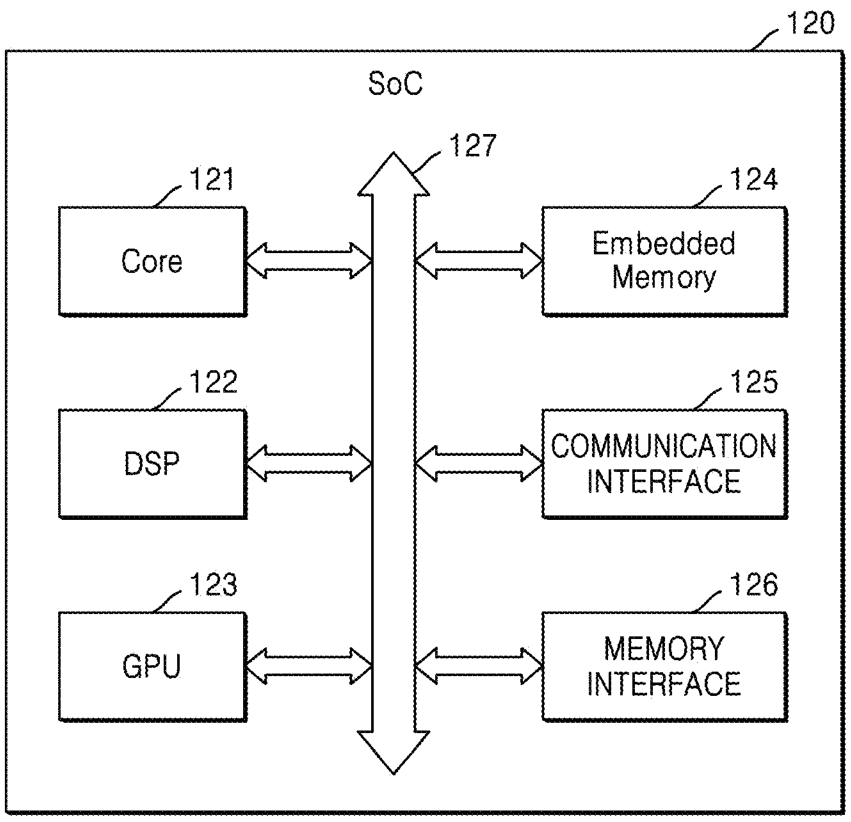
FIG. 12 is a block diagram of a system-on-chip according to an embodiment.

FIG. 12 is a block diagram of a system-on-chip (SoC) 120 according to an embodiment. The SoC 120 may refer to an IC in which components of a computing system or another electronic system may be integrated. For example, an application processor (AP) as an example of the SoC 120 may include a processor and components for other functions. Referring to FIG. 12, the SoC 120 may include one or more of a core 121, a digital signal processor (DSP) 122, a graphics processing unit (GPU) 123, an embedded memory 124, a communication interface 125, or a memory interface 126. The elements of the SoC 120 may communicate with one another through a bus 127.

The elements of the SoC 120 may include flip-flops described herein with reference to the accompanying drawings and/or a counter including the flip-flops. Accordingly, the elements of the SoC 120 may have increased performance and reliability, and may occupy reduced areas. As a result, the efficiency and performance of the SoC 120 may increase.

The core 121 may process instructions and control the operations of the elements of the SoC 120. For example, the core 121 may drive an operating system (OS) by processing a series of instructions and execute applications on the OS. The DSP 122 may generate useful data by processing a digital signal, for example, provided from the communication interface 125. The GPU 123 may generate data, which corresponds to an image output through a display device, from image data provided from the embedded memory 124 or the memory interface 126 or may encode the image data. The embedded memory 124 may store data necessary for the operations of the core 121, the DSP 122, and the GPU 123.

The communication interface 125 may provide a communication network or an interface for one-to-one communication. The memory interface 126 may provide an interface for an external memory of the SoC 120, e.g., dynamic random access memory (DRAM) or flash memory.

While the inventive concept has been particularly shown and described with reference to embodiments thereof, it will be understood that various changes in form and details may be made therein without departing from the spirit and scope of the following claims.

What is claimed is:

1. A flip-flop configured to generate an output toggling according to an input clock, the flip-flop comprising:
- an inverter configured to generate the output by inverting a first data signal;
- a first circuit configured to generate a second data signal based on the input clock, the first data signal, and a latch signal;
- a second circuit configured to generate the latch signal based on the input clock and the second data signal; and
- a third circuit configured to generate the first data signal using the input clock, the second data signal, and the latch signal,
- wherein the third circuit is further configured to pull down the first data signal, independently of the second data signal, using the input clock and the latch signal.

2. The flip-flop of claim 1, wherein the first circuit includes:
- a first p-channel field effect transistor (PFET) and a second PFET connected in series to each other between a positive supply voltage node and an output node, at which the second data signal is generated, the first PFET and the second PFET respectively receiving the input clock and the first data signal;
- a first n-channel FET (NFET) and a second NFET connected in series to each other between the output node and a negative supply voltage node, the first NFET and the second NFET respectively receiving the first data signal and the latch signal;
- a third PFET connected between the positive supply voltage node and the output node and receiving the latch signal; and
- a third NFET and a fourth NFET connected in series to each other between the output node and the negative supply voltage node and respectively receiving the latch signal and the input clock.

3. The flip-flop of claim 2, wherein the second NFET is a component of the first circuit and the third circuit and disposed in a path that pulls down the first data signal.

4. The flip-flop of claim 2, wherein the fourth NFET is a component of the first circuit and the second circuit.

5. The flip-flop of claim 1, wherein the second circuit includes:
- a first p-channel field effect transistor (PFET) and a second PFET connected in parallel between a positive supply voltage node and an output node, at which the latch signal is generated, the first PFET and the second PFET respectively receiving the second data signal and the input clock; and
- a first n-channel FET (NFET) and a second NFET connected in series to each other between the output node and a negative supply voltage node, the first NFET and the second NFET respectively receiving the second data signal and the input clock.

6. The flip-flop of claim 5, wherein the second NFET is a component of the second circuit and the first circuit.

7. The flip-flop of claim 1, wherein the third circuit includes:
- a first p-channel field effect transistor (PFET) connected between a positive supply voltage node and an output node, at which the first data signal is generated;
- a second PFET and a third PFET connected in series to each other between the positive supply voltage node and the output node, and respectively receiving the input clock and the second data signal;
- a first n-channel FET (NFET) and a second NFET connected in parallel between the output node and a second node, the first NFET and the second NFET respectively receiving the input clock and the output; and
- a third NFET connected between the second node and the negative supply voltage node, and configured to receive the latch signal.

8. The flip-flop of claim 7, wherein the third NFET is a component of the third circuit and the first circuit.

9. The flip-flop of claim 7, wherein the second PFET is a component of the third circuit and the first circuit.

10. The flip-flop of claim 1, wherein the second data signal is complementary to, and offset from the first data signal, and
- the output of the flip-flop is a bit in output data output by a counter comprising a plurality of flip-flops, including the flip-flop.

11. A flip-flop configured to generate an output toggling according to an input clock, the flip-flop comprising:
- an inverter configured to generate the output by inverting a first data signal;
- a first circuit configured to generate a second data signal based on the input clock, the first data signal, and a latch signal;
- a second circuit configured to generate the latch signal based on the input clock and the second data signal; and
- a third circuit configured to generate the first data signal based on the input clock, the second data signal, and the latch signal,
- wherein the third circuit includes a first n-channel field effect transistor (NFET) and a second NFET connected between a first output node, at which the first data signal is generated, and a first power node, to which a negative supply voltage is applied, the first NFET and the second NFET respectively receiving the input clock and the latch signal.

12. The flip-flop of claim 11, wherein the first circuit includes:
- a first p-channel FET (PFET) and a second PFET connected in series to each other between a second power node, to which a positive supply voltage is applied, and a second output node, at which the second data signal is generated, the first PFET and the second PFET respectively receiving the input clock and the first data signal;
- a third NFET connected between the second output node and the second NFET and receiving the first data signal;
- a third PFET connected between the second power node and the second output node and receiving the latch signal; and
- a fourth NFET and a fifth NFET connected in series to each other between the second output node and the first power node and respectively receiving the latch signal and the input clock.

13. The flip-flop of claim 12, wherein the second circuit includes:
- a fourth PFET and a fifth PFET connected in parallel between the second power node and a third output node, at which the latch signal is generated, the fourth PFET and the fifth PFET respectively receiving the second data signal and the input clock; and a sixth NFET connected between the third output node and the fifth NFET and receiving the second data signal.

14. The flip-flop of claim 12, wherein the third circuit further includes:

a sixth PFET connected between the second power node and the first output node and receiving the latch signal;

a seventh PFET connected between the first PFET and the first output node and receiving the second data signal; and a seventh NFET connected between the first output node and the second NFET and receiving the output.

15. The flip-flop of claim 11, wherein the second data signal is complementary to, and offset from the first data signal, and the output of the flip-flop is a bit in output data output by a counter comprising a plurality of flip-flops, including the flip-flop.

16. A method of generating an output toggling according to an input clock, the method comprising:

generating the output by inverting a first data signal;

generating a second data signal by inverting the first data signal when the input clock is logic low and by inverting a latch signal when the input clock is logic high;

generating the latch signal as logic high when the input clock is logic low and generating the latch signal by inverting the second data signal when the input clock is logic high; and holding the first data signal when the input clock is logic low and generating the first data signal by inverting the latch signal when the input clock is logic high.

17. The method of claim 16, wherein the first data signal is generated by pulling down, when the input clock and the latch signal are logic high, an output node at which the first data signal is generated.

18. The method of claim 16, wherein the second data signal is generated by:

first to third p-channel field effect transistors (PFETs) respectively receiving the input clock, the first data signal, and the latch signal;

a first n-channel FET (NFET) and a second NFET respectively receiving the first data signal and the latch signal; and a third NFET and a fourth NFET respectively receiving the latch signal and the input clock.

19. The method of claim 16, wherein the latch signal is generated by:

a first p-channel field effect transistor (PFET) and a second PFET respectively receiving the second data signal and the input clock; and a first n-channel FET (NFET) and a second NFET respectively receiving the second data signal and the input clock.

20. The method of claim 16, wherein the first data signal is generated by first to third p-channel field effect transistors (PFETs) respectively receiving the latch signal, the input clock, and the second data signal and first to third n-channel FETs (NFETs) respectively receiving the input clock, the output, and the latch signal.

* * * * *